Oct. 24, 1972 E. B. CROSON 3,700,445

PHOTORESIST PROCESSING METHOD FOR FABRICATING ETCHED MICROCIRCUITS

Filed July 29, 1971 7 Sheets-Sheet 1

CONDUCTOR/RESISTOR SELECTIVE ETCHING PROCESS

ALIGNMENT ERRORS FOR CONDUCTOR/RESISTOR SELECTIVE ETCHING PROCESS OF FIG. 1.

CONDUCTOR-RESISTOR-CONDUCTOR SELECTIVE ETCHING PROCESS

ALIGNMENT ERRORS FOR CONDUCTOR-RESISTOR-CONDUCTOR SELECTIVE ETCHING PROCESS OF FIG. 3.

STEP 5
EXPOSED RESISTOR MATERIAL IS REMOVED WITH A SELECTIVE SOLVENT

STEP 6
THE POSITIVE PHOTO-RESIST IS REMOVED, BARING THE CONDUCTOR MATERIAL COVERING THE RESISTOR MATERIAL

STEP 7
THE EXPOSED CONDUCTOR MATERIAL COVERING THE RESISTOR MATERIAL IS REMOVED WITH A SELECTIVE SOLVENT

STEP 8
THE NEGATIVE PHOTO-RESIST IS REMOVED, AND THE PROCESS IS COMPLETED

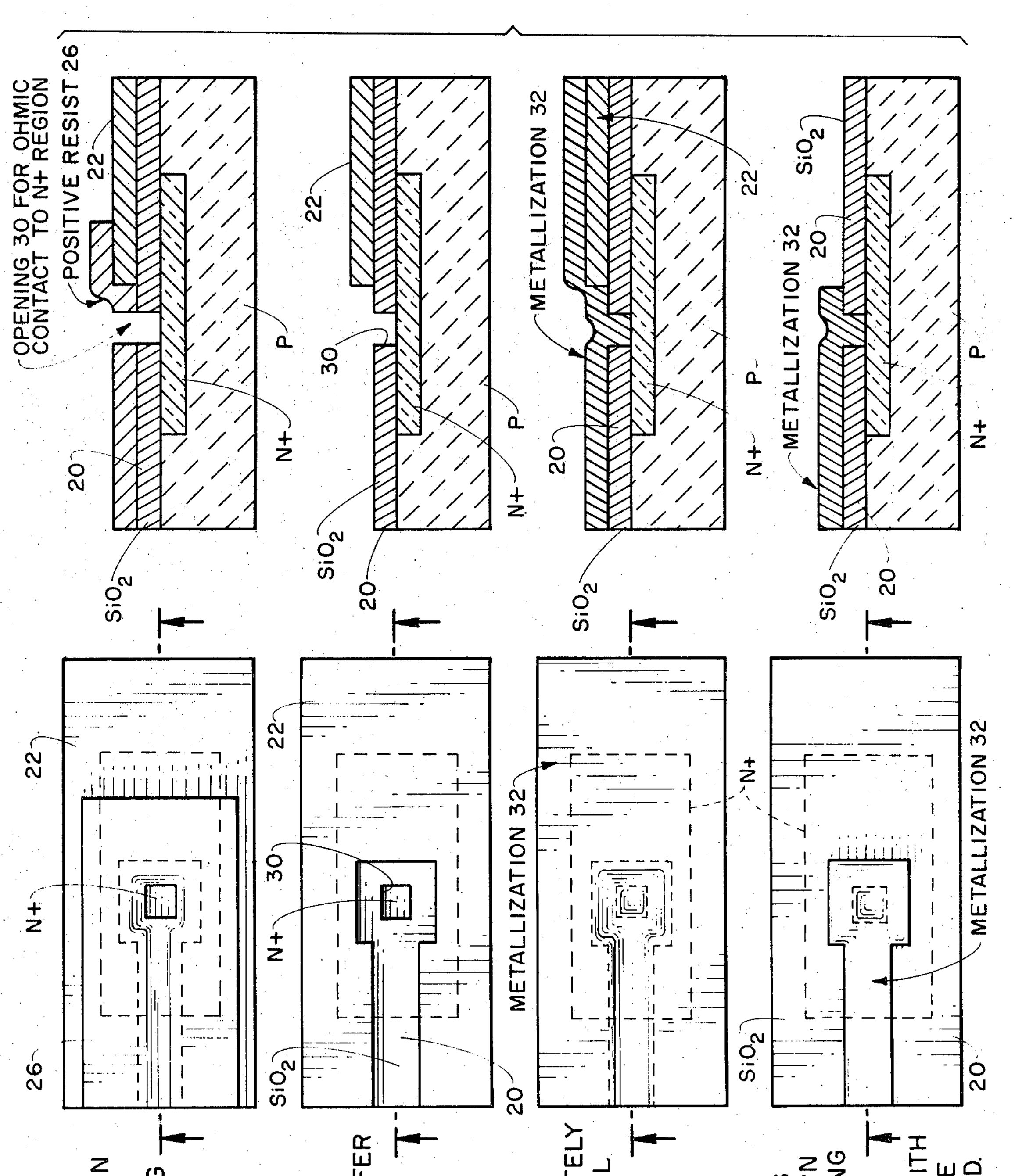

Fig. 6B.

STEP 4
THE WAFER IS PLACED IN AN ETCHANT TO OPEN "VIAS" FOR CONTACTING THE SEMICONDUCTOR

STEP 5
THE POSITIVE RESIST IS REMOVED AND THE WAFER IS READY FOR METALLIZATION

STEP 6
THE WAFER IS COMPLETELY COVERED WITH A METAL FILM (e.g.- aluminum)

STEP 7
THE NEGATIVE RESIST IS REMOVED, WHICH IN TURN REMOVES THE OVERLYING METALLIZATION. THE LATTER REMAINS IN AREAS NOT COVERED WITH PHOTO-RESIST. THUS THE PROCESS IS COMPLETED.

3,700,445
PHOTORESIST PROCESSING METHOD FOR FABRICATING ETCHED MICROCIRCUITS

Eddie B. Croson, Ventura, Calif., assignor to the United States of America as represented by the Secretary of the Navy

Filed July 29, 1971, Ser. No. 167,325
Int. Cl. G03c *5/00*
U.S. Cl. 96—36.2 4 Claims

ABSTRACT OF THE DISCLOSURE

A photoresist process especially suitable for fabricating etched thin-film microcircuits. By the use of both positive and negative photoresists during the same processing cycle, most mask alignment problems are eliminated. Also, since only a single post-bake period is necessary, a major reduction in overall processing time is achieved.

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The fabrication of thin-film microcircuits conventionally includes the extensive application of photoresist materials. These materials require photochemical processing, which because of its nature is both costly and time-consuming.

The two principal selective-etching techniques in use at this time are (1) the conductor/resistor process, and (2) the conductor/resistor/conductor process. The former employs a substrate metallized with a thin-film resistor layer overcoated with a thin-film conductor layer; e.g., gold over Nichrome. The conductor pattern is delineated by photoresist processing, and excessive conductor material is removed by chemical etching. The photoresist process is repeated for the resistor pattern and excess resistor material is removed by a selective resistor material etchant.

The conductor/resistor/conductor process is similar except the first pattern to be processed is the combined conductor/resistor network. Following photoresist pattern delineation, excess conductor and resistor materials are removed by etching in appropriate solutions. After cleaning, the substrate is re-coated with photoresist and the conductor pattern is aligned, exposed, and developed. Conductor material covering the desired resistor network is then removed by a selective conductor etchant.

The first-described process has the advantage of requiring fewer etching steps, and also reduces the degree of precision needed in mask alignment. However, angular misalignment of this mask can result in variations in the length-to-width ratio of the resistor pattern. The latter process, on the other hand, offers the advantage of having the resistor pattern protected by a conductor material overlay during all etching steps. This is offset by difficulties encountered during mask alignment, which can lead to changes in resistance values as a result of variations in length-to-width ratios of the resistor pattern.

In both of the above processes, the time required for complete fabrication of the assembly may run to over two hours, due largely to the inclusion of two post-bake periods of one-half hour duration each. Attempts to reduce this manufacturing time without sacrifice of production quality have not heretofore been successful.

SUMMARY OF THE INVENTION

The present concept has a three-fold advantage over presently-known techniques (1) photochemical processing time is reduced by at least 25%; (2) mask-alignment problems are eased; and (3) the number of rejects is held to a minimum. This is accomplished by employing both positive and negative photoresists during the same processing cycle—that is, negative photoresist is used for the conductor pattern and positive photoresist for the resistor pattern. In addition, both photoresist steps are carried out before any chemical etching is done.

STATEMENT OF THE OBJECTS OF THE INVENTION

It is a general object of this invention to provide an improved process for fabricating thin-film microcircuits on an insulating substrate.

It is a further object of this invention to reduce misalignment errors in such a process and hence materially raise the acceptance-to-rejection ratio of the finished products.

It is an additional object of the invention to shorten the time required for manufacturing such components by reducing the number of processing steps normally required.

Other objects, advantages and novel features of the invention will become apparent from the following detailed description of the invention when considered in conjunction with the accompanying drawings wherein:

BRIEF DESCRIPTION OF THE DRAWINGS

FIG. 6B sets forth the final four steps of the process partially described in FIG. 6A.

DESCRIPTION OF THE PREFERRED EMBODIMENT

Figure 1:
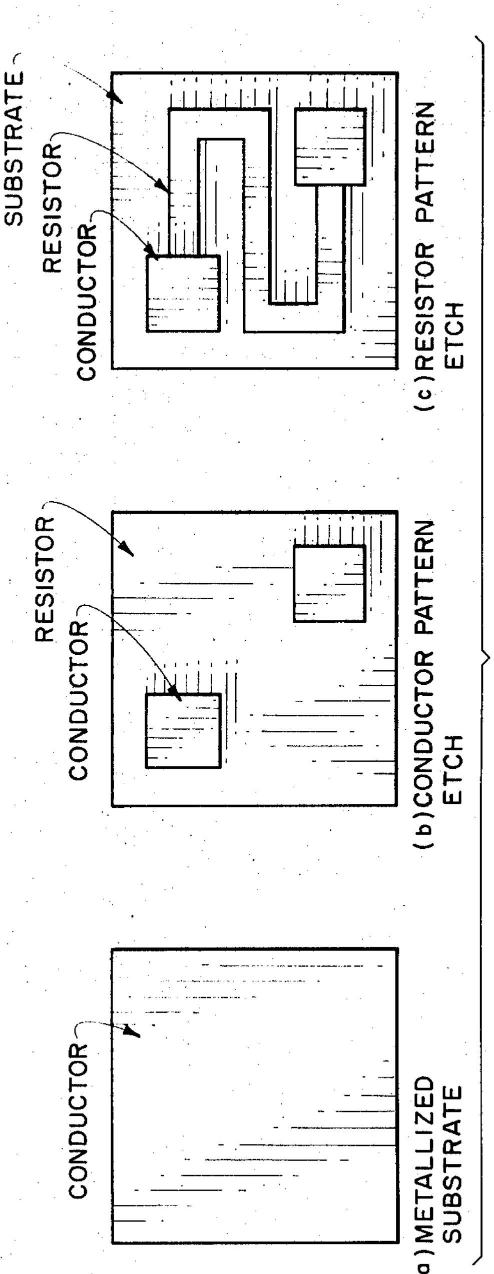
Fig. 1. (PRIOR ART)
FIG. 1 is a simplified showing of a conductor-resistor selective etching process as now known in the art.
Figure 2:
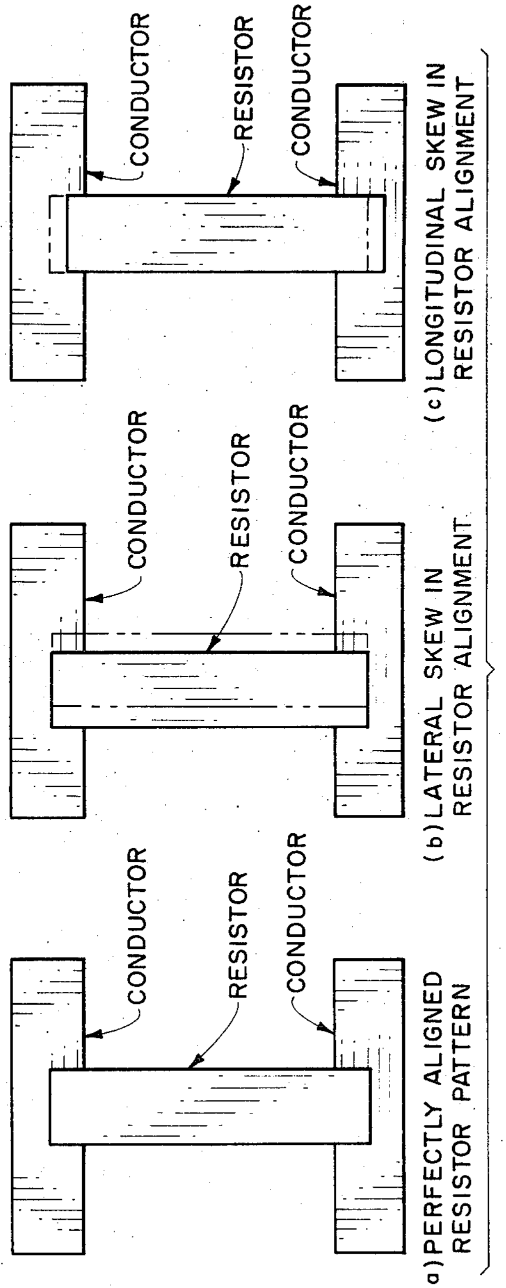
Fig. 2. (PRIOR ART)
FIG. 2 illustrates certain alignment errors which frequently result when practicing the process of FIG. 1.

Before describing the present concept, a brief discussion of two photoresist processing methods now in standard use may be helpful, particularly in understanding their drawbacks. FIG. 1 of the drawings is representative of the conventional conductor-resistor method, which frequently results in alignment errors of the type shown in FIG. 2. While purely lateral skew (FIG. 2*b*) or purely longitudinal skew (FIG. 2*c*) in resistor alignment do not affect the electrical values, angular misalignment does so, since it changes the length-to-width ratio of the resistor pattern.

Figure 3:
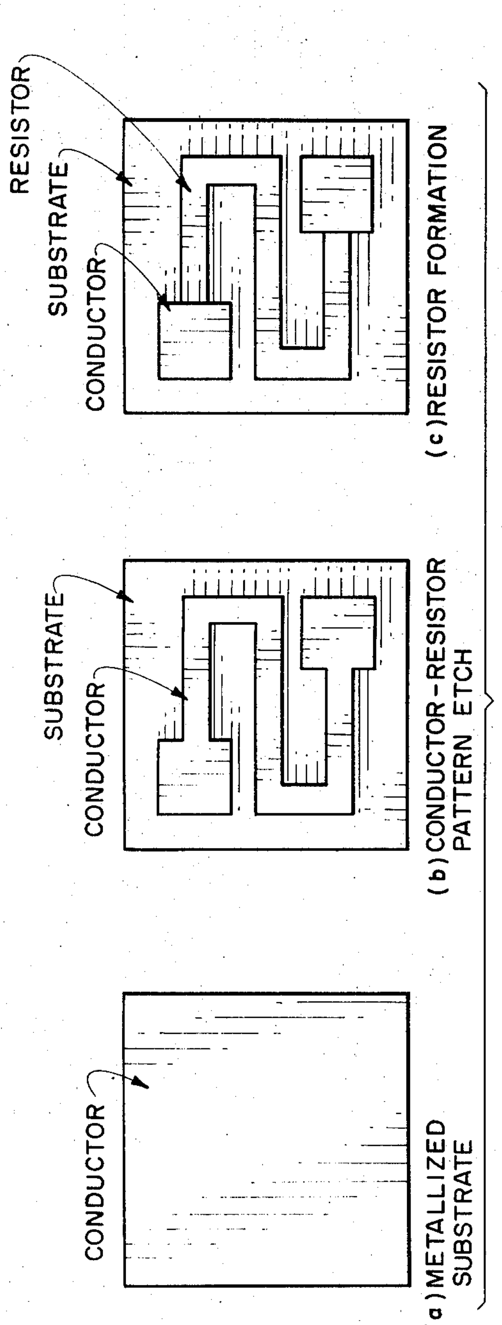
Fig. 3. (PRIOR ART)
FIG. 3 is a simplified showing of a conductor-resistor-conductor selective etching process as now known in the art.
Figure 4:
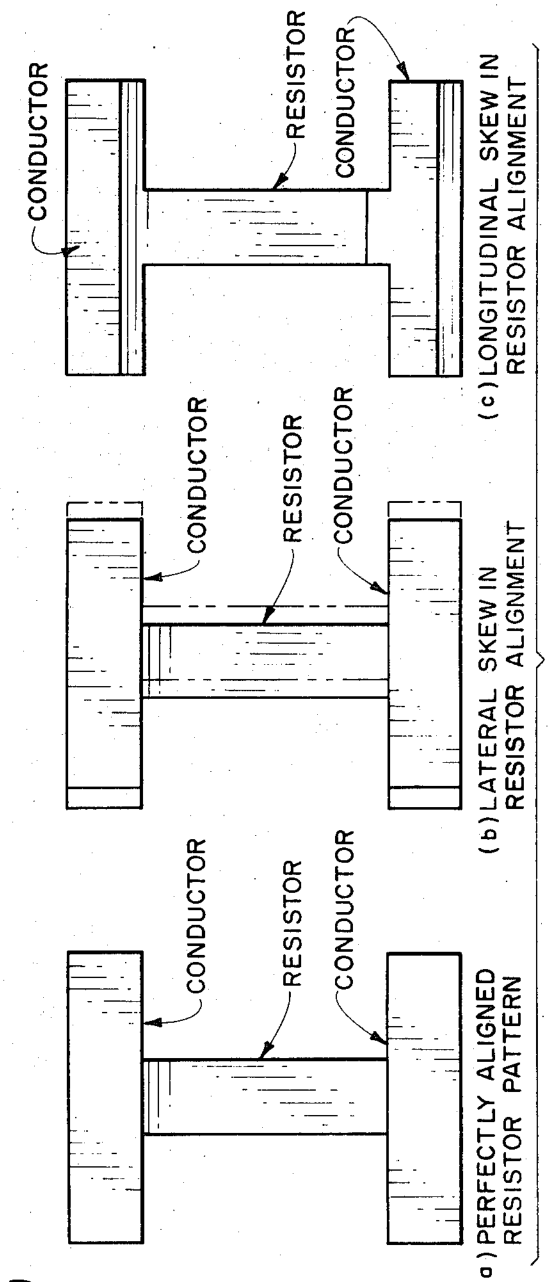
Fig. 4. (PRIOR ART)
FIG. 4 illustrates certain alingment errors which frequently result when practicing the process of FIG. 3.

The conductor-resistor-conductor process of FIG. 3 offers the advantage of the resistor pattern being protected by a conductor material overlay during all etching steps. However, it presents difficulties in proper mask alignment, and such alignment errors in the resistor network, as shown in FIGS. 4(*b*) and (*c*), result in a change in resistance value due to the variation in length-to-width ratio.

Of possibly even more importance than the above is the time required for completing such prior art processes. One example which is representative of a conventional conductor-resistor selective etching process is given by the following table:

TABLE I.—REPRESENTATIVE SELECTIVE ETCHING PROCESS OF PRIOR ART

| | Process | Process time (min.) |
|---|---|---|
| Step number: | | |
| 1 | Cleaning | 10 |
| 2 | Drying | 5 |
| 3 | Photoresist application | 3 |
| 4 | Pre-bake | 5 |
| 5 | Photoresist exposure | 3 |
| 6 | Photoresist development | 2 |
| 7 | Post bake | 30 |
| 8 | Conductor etching | 1 |
| 9 | Photoresist removal | 5 |
| 10 | Cleaning | 10 |
| 11 | Drying | 5 |
| 12 | Photoresist application | 3 |
| 13 | Pre-bake | 5 |
| 14 | Photoresist exposure | 3 |
| 15 | Photoresist development | 2 |
| 16 | Post bake | 30 |
| 17 | Resistor etching | 1 |
| 18 | Photoresist removal | 5 |
| 19 | Final cleaning | 10 |
| Total processing time | | 138 |

Obviously such times are only illustrative and will vary at different facilities. For the conductor-resistor-conductor method, the total time will be even longer due to the additional etching step.

It has been found that all of the advantages of the conductor-resistor and conductor-resistor-conductor selective etching processes as known in the art can be obtained without their attendant drawbacks. The key to this novel concept is the use of both positive and negative photoresists *during the same processing cycle*. This not only results in a considerable time saving, but also reduces mask alignment problems.

Figure 5A:
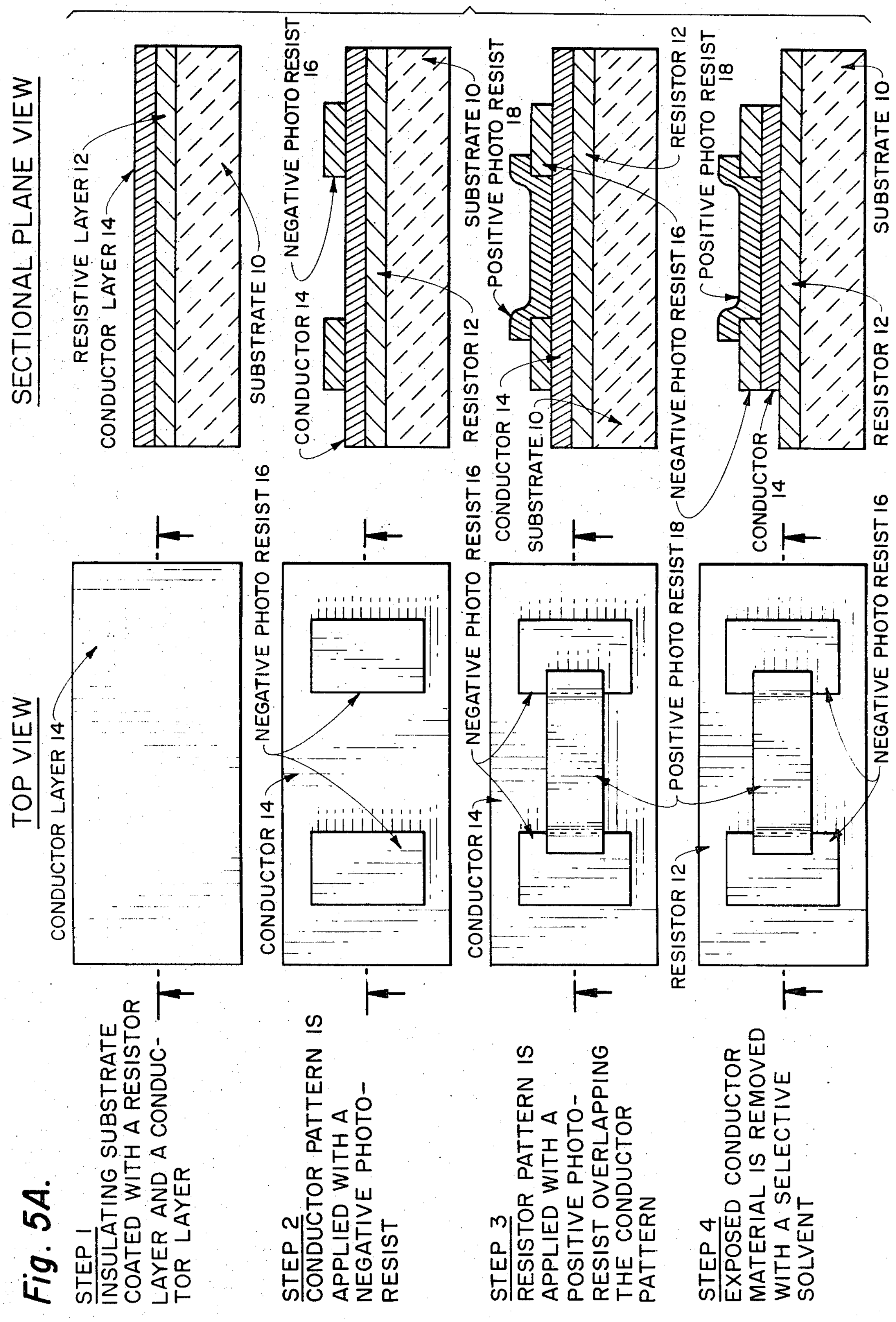
FIG. 5A sets forth the first four steps of a process conducted in accordance with one embodiment of the present invention.
Figure 5B:
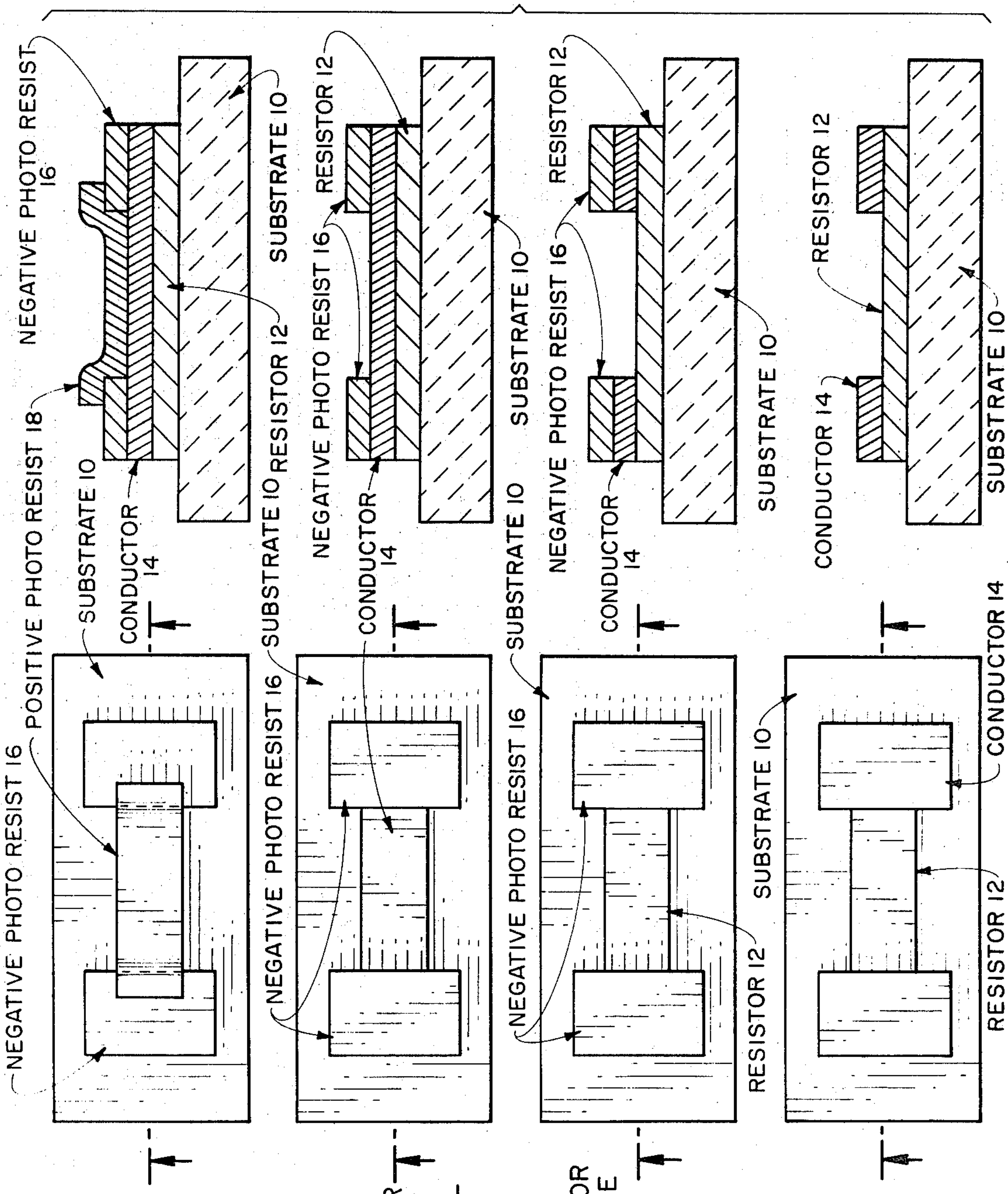
FIG. 5B sets forth the final four steps of the process partially described in FIG. 5A.

The process of the present invention features the use of a negative photoresist for the conductor pattern, and a positive photoresist for the resistor pattern. Furthermore, *both photoresist steps are accomplished before any chemical etching*. The basic steps, as set forth in FIGS. 5A and 5B of the drawing, are:

STEP 1

An insulating substrate 10 is coated with a layer 12 of resistor material and a layer 14 of conductor material. Substrate 10 may be ceramic, paper phenolic, paper epoxy, glass epoxy, or Mylar, for example, while the conductor material 14 may be gold, copper, or silver, for example. The resistor material 12 may be chromium, nickel-chromium alloy, etc.

STEP 2

The conductor pattern is applied with a negative photoresist 16. It has been found that Eastman Kodak's "Thin Film Resist (KTFR)" is particularly suitable for this purpose.

STEP 3

The resistor pattern is applied with a positive photoresist 18 overlapping the conductor pattern. This positive resist may be that manufactured by the Shipley Company and identified as AZ-1350 H.

STEP 4

After exposure, the exposed portion of the conductor material 14 is removed with a selective solvent.

STEP 5

The exposed portion of the resistor material 12 is now removed with a selective solvent.

STEP 6

The positive photo resist 18 is removed, baring the conductor material 14 covering the resistor material 12.

STEP 7

The exposed portion of the conductor material 14 covering the resistor material 12 is removed with a selective solvent.

STEP 8

The negative photoresist 16 is removed, and the process is completed.

Figure 6A:
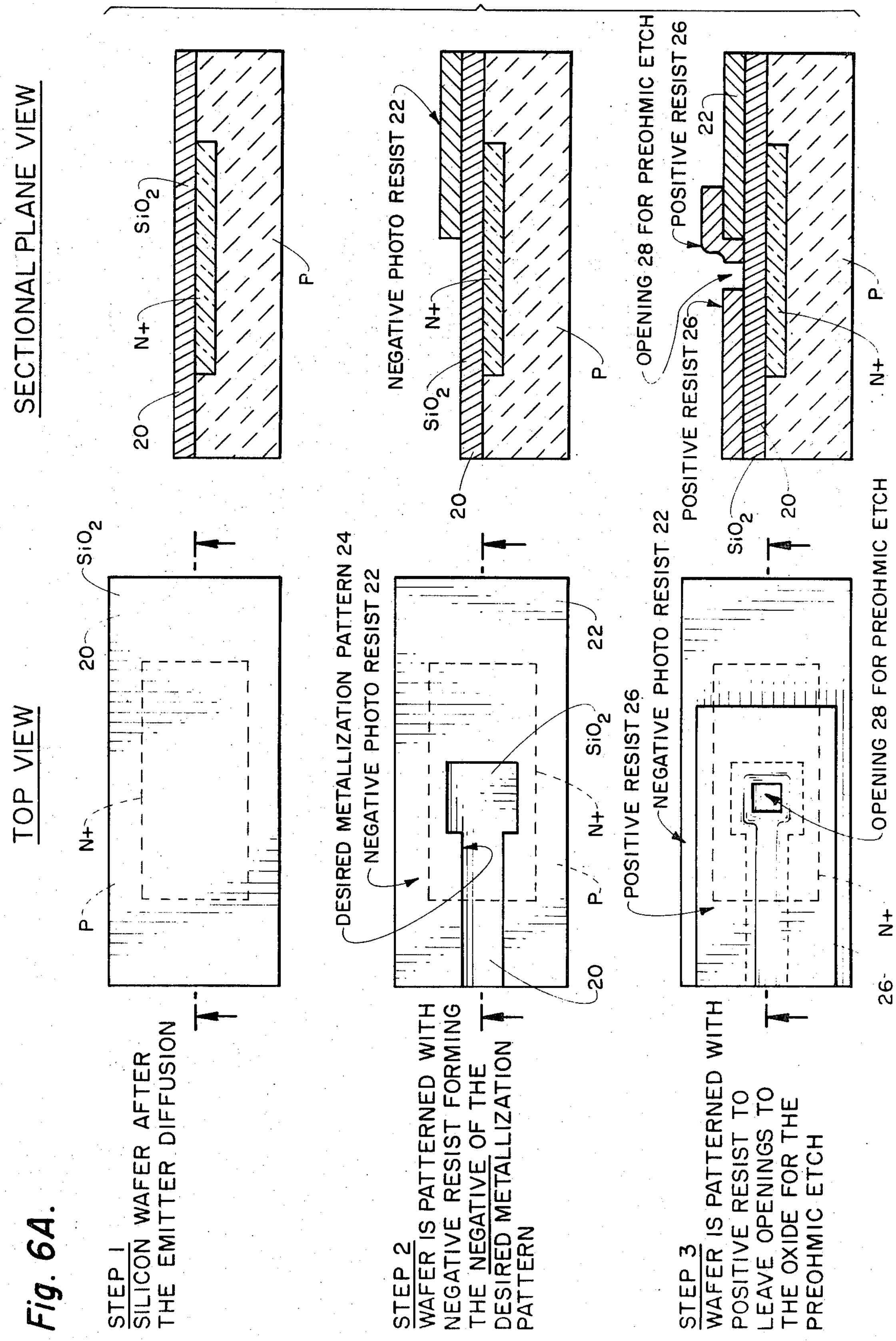
FIG. 6A sets forth the first three steps of a process conducted in accordance with a further embodiment of the present invention.

One specific application of the present concept is set forth in the method disclosed in FIGS. 6A and 6B of the drawings. As indicated therein, the following steps are representative:

STEP 1

A silicon wafer 20 is prepared for processing.

STEP 2

The wafer 20 is patterned with negative resist 22 forming the *negative* of a desired metallization pattern 24.

STEP 3

The wafer 20 is patterned with positive resist 26 to leave openings 28 to the oxide for the preohmic etch.

STEP 4

The wafer 20 is placed in an etchant to form openings or "vias" 30 for contacting the semiconductor material N+.

STEP 5

The positive resist 26 is removed and the wafer 20 is ready for metallization.

STEP 6

The wafer 20 is completely covered with a metal film 32 of some material such as aluminum.

STEP 7

The negative resist 22 is removed, which in turn removes only that portion of the metal film 32 which *overlies* the negative resist. The metallization remains in all areas *not* covered with photoresist, and the process is completed.

The most critical step in the process is the removal of the positive photoresist without damaging the negative photoresist pattern. Two methods have been employed to remove the positive resist. These are (1) chemical stripping, and (2) re-exposure and development.

(1) Chemical stripping can be accomplished by rinsing the substrate in acetone or a similar solvent. Care must be exercised when using this stripping method to insure that all of the positive resist is removed and that the negative resist pattern has not been affected by the chemical stripper.

(2) The second method takes advantage of a unique feature of positive photoresist; i.e., re-exposure and development. The entire substrate is exposed to ultraviolet light and developed. The remaining positive resist is polymerized and becomes soluble in the developing solution. This method, though a little more time consuming, insures that all the positive resist is removed without detrimental effects on the negative resist pattern.

Steps for a typical double-resist selective etching process performed in accordance with the present invention are set forth in Table 2.

TABLE 2.—INVENTION PROCESS OF DOUBLE-RESIST SELECTIVE ETCHING

| Step number | Process | Process time (min.) |
|---|---|---|
| 1 | Cleaning | 10 |
| 2 | Drying | 5 |
| 3 | Negative photo resist application. | 3 |
| 4 | Pre-bake | 5 |
| 5 | Conductor pattern exposure. | 3 |
| 6 | Negative resist development. | 2 |
| 7 | Drying | 5 |
| 8 | Positive photo resist application. | 3 |
| 9 | Pre-bake | 5 |
| 10 | Resistor pattern exposure. | 3 |
| 11 | Positive resist development. | 2 |
| 12 | Post bake | 30 |
| 13 | Conductor etching | 1 |
| 14 | Resistor etching | 1 |
| 15 | Negative resist removal[1] | 1 |
| 16 | Conductor etching | 1 |
| 17 | Photo resist removal | 5 |
| 18 | Final cleaning | 10 |
| Total processing time | | 95 |

[1] Chemical stripping with acetone.

The positive photo-resist stripping technique used in Table 2 consists of a 20-second rinse in acetone. A comparison of Table 1 and Table 2 reveals a 31% reduction in processing time by utilizing the invention double-resist process. A 27% reduction in processing time results if the positive photoresist is removed by re-exposure and development.

It is readily apparent that the major reduction in processing time stems from the single post-bake period required by the invention process. The savings in process time for a particular facility is therefore dependent on the duration of the post-bake period. The 30 minute post-bake periods in Tables 1 and 2 represent an average of the post-bake times derived from an industry survey.

In addition to the saving in time, use of positive photoresist for the resistor masking in the double resist process greatly simplifies resistor mask alignment. The negative photoresist conductor pattern is readily visible through the resistor mask and does not present any alignment problems. Should misalignment occur, the positive photoresist can easily be removed by re-exposure and development, a new coat applied, and the process continued.

One aspect of the disclosed double-resist process requiring careful attention is the negative resist-positive resist interface. The primary considerations are: (1) The adhesion of the positive resist to the negative resist, and (2) the ability of the positive resist to maintain continuity across the step created by the negative resist. The positive resist must adhere both to the substrate and to the negative resist, and must also conform to the graded profile created by the negative resist conductor pattern. Photomicrographs of the interface indicate that the positive-resist coating is continuous and conformal. The resistor line width is approximately 10 mils in one example. However, the process has also been with 1-mil resistor line widths without pattern degradation.

Figure 7:
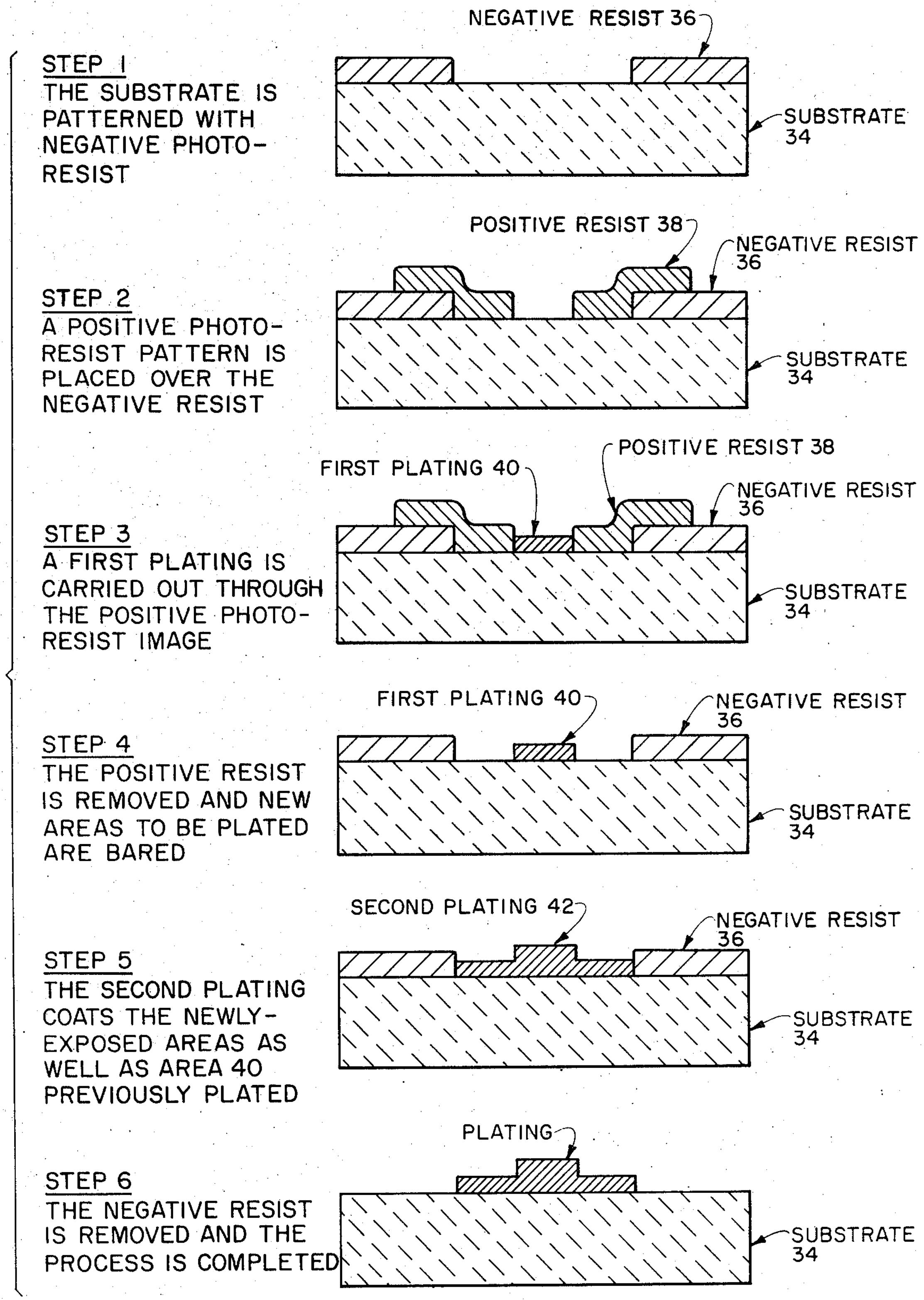
FIG. 7 sets forth the steps of a process conducted in accordance with a still further embodiment of the present invention.

Applications of the disclosed double-resist process are not confined to selectively etching thin-film microcircuits. The process is equally applicable to such diverse uses as selective plating, chemical milling, and any photo/chemical process requiring more than one photoresist application. For example, a method of selective plating is set forth in FIG. 7 of the drawings. In this process, the following steps are carried out:

STEP 1

A substrate 34 is patterned with negative photoresist 36.

STEP 2

A positive photoresist pattern 38 is placed over the negative resist 36.

STEP 3

A first plating 40 is applied through the positive photoresist image, the area plated being determined by the resist pattern.

STEP 4

The positive resist 38 is removed, and new areas to be plated are bared.

STEP 5

A second plating 42 is applied, the area plated being determined by the negative resist pattern. This second plating covers the newly-exposed areas as well as those previously plated in Step 3.

STEP 6

The negative resist 36 is removed, and the process is completed.

Although several embodiments of the invention have been set forth in detail, various modifications are to be understood as coming within the scope of the concept. For example, it is feasible if desired to use positive photoresist with separate, but specific, spectral sensitivities. With this method, a desired photoresist image is formed by coating a surface with photoresist sensitive to light (radiation) of specific wave length or spectrum. The second image would be formed by a photoresist sensitive to a separate wave length or spectrum, and so on. As each processing step is completed, the photoresist for that step is removed by exposure to radiation of the proper wave length or spectrum, and then developed. As many layers of photoresist as is necessary are utilized, each photoresist layer being sensitive to a specific wave length or spectrum.

Obviously many modifications and variations of the present invention are possible in the light of the above teachings. It is therefore to be understood that within the scope of the appended claims the invention may be practiced otherwise than as specifically described.

I claim:

1. A process for making a printed circuit pattern on a substrate of dielectric material one surface of which is coated with a layer of conductive material overlying a layer of resistive material, said process including the steps of:

(a) delineating a conductor pattern by applying negative photoresist to said conductor layer
(b) delineating a resistor pattern by applying positive photoresist so as to overlap the conductor pattern
(c) exposing the conductor pattern
(d) removing the exposed conductor material with a selective solvent
(e) exposing the resistor pattern
(f) removing the exposed resistor material with a selective solvent
(g) removing the positive photoresist so as to bare the conductor material covering the resistor material
(h) removing the exposed conductor material covering the resistor material with a selective solvent, and
(i) removing the negative photoresist.

2. A process for making electrical contact to a silicon wafer having doped regions, said wafer being covered with a layer of insulating material, said process including:

(a) applying negative resist to said insulating layer to form the negative of a desired metallization pattern
(b) applying positive resist to said wafer to leave openings for a preohmic etch (c) placing the wafer in an etchant to create openings extending to said doped region (d) removing the positive resist (e) completely covering the wafer with a metal film, and (f) removing the negative resist so as to also remove the overlying metallization, the latter remaining only in areas not covered with resist.

3. The process of claim 2 in which the metal of said film is aluminum.

4. The method of selectively plating one surface of a member so as to form a desired pattern, said method including:

(a) applying negative photoresist to said member so as to form part of the said desired pattern (b) applying positive photoresist to said member so as to form the remainder of the said desired pattern (c) performing a first plating operation through the positive photoresist pattern.

(d) removing the positive photoresist (e) performing a second plating operation through the negative photoresist pattern, said second plating also covering the material deposited by said first plating, and (f) removing the negative photoresist.

References Cited

UNITED STATES PATENTS

| | | | |
|---|---|---|---|
| 3,620,736 | 1971 | Tarkinton | 96—36.2 |
| 3,412,456 | 1968 | Ebisawa | 96—36.2 |
| 3,649,392 | 1972 | Schneck | 96—36.2 |
| 3,423,205 | 1969 | Skaggs et al. | 96—36.2 |
| 3,442,647 | 1969 | Klasens | 96—36.2 |
| 3,525,617 | 1970 | Bingham | 96—36.2 |
| 3,506,441 | 1970 | Gottfried | 156—11 |
| 3,546,010 | 1970 | Gartner et al. | 156—17 |

NORMAN G. TORCHIN, Primary Examiner

E. C. KIMLIN, Assistant Examiner

U.S. Cl. X.R.

156—3, 11, 17